(12) United States Patent
Chiu et al.

(10) Patent No.: US 6,497,993 B1
(45) Date of Patent: Dec. 24, 2002

(54) IN SITU DRY ETCHING PROCEDURE TO FORM A BORDERLESS CONTACT HOLE

(75) Inventors: Yuan-Hunh Chiu, Taipei (TW); Hun-Jan Tao, Hsinchu (TW); Chia-Shiung Tsai, Hsin-Chu (TW); Chu-Yun Fu, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 77 days.

(21) Appl. No.: 09/614,010

(22) Filed: Jul. 11, 2000

(51) Int. Cl.$^7$ .................................................. G03F 7/36
(52) U.S. Cl. ........................ 430/313; 430/317; 216/41; 216/72
(58) Field of Search ...................... 430/311, 313, 430/317; 216/41, 72; 438/624

(56) References Cited

U.S. PATENT DOCUMENTS

| | | | |
|---|---|---|---|
| 5,460,693 A | 10/1995 | Moslehi | 156/662.1 |
| 5,612,240 A | 3/1997 | Chang | 437/44 |
| 5,880,019 A | 3/1999 | Hsieh et al. | 438/666 |
| 5,922,515 A | 7/1999 | Chiang et al. | 430/312 |
| 5,932,487 A | 8/1999 | Lou et al. | 438/692 |
| 5,942,446 A | 8/1999 | Chen et al. | 438/734 |

*Primary Examiner*—Kathleen Duda
(74) *Attorney, Agent, or Firm*—George O. Saile; Stephen B. Ackerman

(57) ABSTRACT

A process for forming a contact hole opening, featuring the use in situ dry etching, and photoresist removal procedures, used to define the desired contact hole opening; in an overlying hard mask layer, in the dielectric layer, and in an underlying insulator stop layer, has been developed. The process features the initial definition of the contact hole opening, in an overlying hard mask insulator layer, accomplished in a chamber of a dry etch tool, followed by removal of an overlying, contact hole defining photoresist shape, performed in situ, in the same dry etch chamber. The contact hole opening is then transferred to the dielectric layer via a selective dry etch procedure, performed in situ, in the dry etch chamber, using the overlying hard mask insulator layer as an etch mask. A final dry etch procedure is then performed in situ, in the same dry etch chamber, to form the contact hole opening in the underlying insulator stop layer, with the final dry etch procedure also resulting in the removal of the exposed hard mask insulator layer, thus creating the desired contact hole opening in a dielectric layer, and in the underlying insulator stop layer.

23 Claims, 2 Drawing Sheets

IN SITU DRY ETCHING PROCEDURE TO FORM A BORDERLESS CONTACT HOLE

BACKGROUND OF THE INVENTION (1) Field of the Invention

The present invention relates to methods used to fabricate semiconductor devices, and more specifically to a method used to form a borderless contact hole to an underlying conductive region (2) Description of Prior Art The trend to micro-minituriaztion, or the ability to fabricate semiconductor devices with features smaller than 0.50 micrometers, has presented difficulties when attempting to form narrow diameter, deep contact holes in a dielectric layer, to expose underlying conductive regions. The use of photoresist as a mask for etching of a thick dielectric layer presents selectivity concerns in regards to a fast removal etch rate of the photoresist, in the dielectric layer etching ambient, therefore not allowing only the photoresist shape to be used as the etch mask. Increasing the thickness of the photoresist mask to accommodate the non-selectivity of the etch ambient only reduces the resolution needed to define deep, narrow diameter openings. The use of a hard mask layer, with increased etch rate selectivity to the material being etched, results in additional process cost as a result of the ex-situ removal of the photoresist shape, performed after the photoresist shape had been used to define the desired opening in the hard mask layer. In addition, ex situ removal of the hard mask layer, also results in unwanted additional process cost.

This invention will describe a process for defining a narrow diameter, contact hole opening, in a thick dielectric layer, featuring in situ removal of the defining photoresist shape, after transferring the desired contact hole shape to a hard mask insulator layer. The present invention will then teach a process in which the desired contact hole opening is in situ formed in the thick dielectric layer, followed by an in situ procedure which defines the desired opening in a bottom insulator stop layer, while removing the hard mask insulator layer from the top surface of the thick dielectric layer. This completely in situ, dry etch procedure, allows the attainment of a borderless contact to be realized. Prior art such as Chiang et al, in U.S. Pat. No. 5,922,515, describe a process for forming a deep contact hole in a dielectric layer, using a hard mask layer, however that prior art does not teach the complete in situ, selective dry etch procedure, described in the present invention featuring in situ removal of the hard mask insulator layer during definition of the contact hole opening in a bottom insulator stop layer.

SUMMARY OF THE INVENTION

It is an object of this invention to define a narrow diameter, deep contact hole opening, in a dielectric layer, using an in situ, dry etching procedure.

It is another object of this invention to initially define the desired contact hole opening in a hard mask insulator layer, using a photoresist shape as an etch mask, followed by the in situ removal of the defining photoresist shape.

It is still another object of this invention to use the hard mask as a etch mask to in situ define the desired contact hole opening in a dielectric layer, with the selective, in situ dry etching procedure terminating on an underlying stop layer.

It is still yet another object of this invention to in situ define a borderless contact hole opening in the stop layer, again using the hard mask insulator layer as an etch mask, exposing an underlying conductive region, and resulting in the in situ removal of the hard mask insulator layer from the top surface of the dielectric layer.

In accordance with the present invention an in situ, dry etch procedure, used to form a borderless contact hole opening in a dielectric layer, is described. After defining a desired contact hole opening in an overlying hard mask insulator layer, via a dry etching cycle using a photoresist shape as an etch mask, the photoresist shape is in situ removed. Another in situ, dry etch cycle is next used to selectively transfer the contact hole opening, defined in the overlying hard mask insulator layer, to a thick dielectric layer, with the selective dry etching procedure terminating at the appearance of an underlying insulator stop layer. Finally another in situ dry etching cycle is used to define the desired contact hole opening in the underlying insulator stop layer, exposing a portion of the top surface of a conductive region, resulting in a borderless contact hole opening. The dry etching cycle used for the opening of the insulator stop layer also results in the in situ removal of the exposed hard mask insulator layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
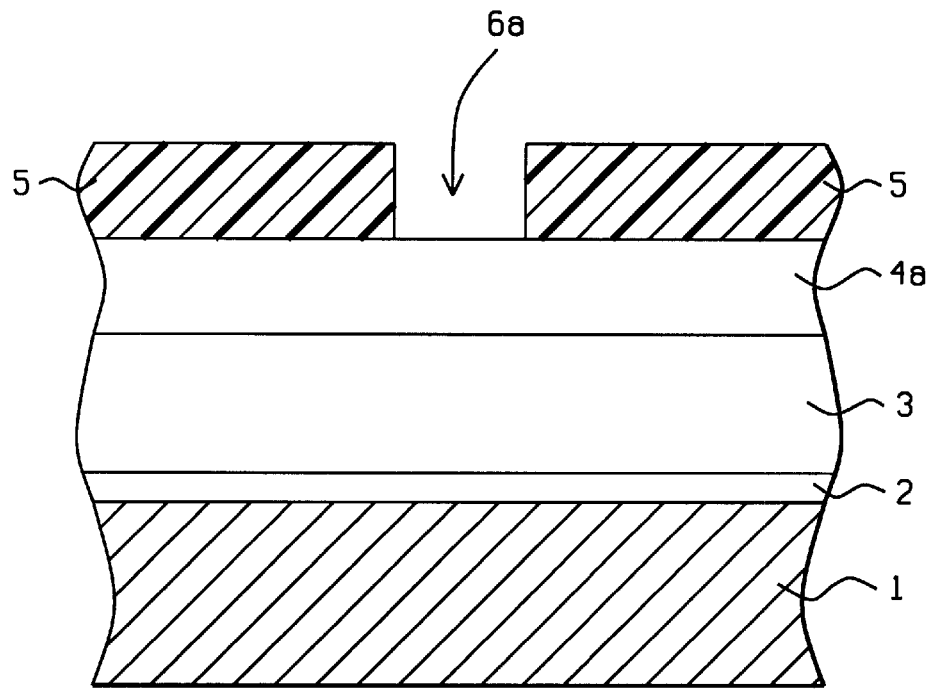
FIGS. 1–5, which schematically, in cross-sectional style, show key stages of fabrication used to define a borderless contact hole opening, using in situ, dry etching procedures.

The method of forming a borderless contact hole opening, in a dielectric layer, using in situ dry etching procedures, will now be described in detail. FIG. 1, schematically shows conductive region 1, which will be exposed at the conclusion of the borderless contact opening described in this invention. Conductive region 1, can be a metal silicide layer, such as cobalt silicide, titanium silicide or nickel silicide, which had been formed on a polysilicon, or single crystalline feature. An Insulator layer 2, such as silicon oxynitride, (SiON), or silicon nitride, ($Si_3N_4$), is formed on conductive region 1, at a thickness between about 200 to 600 Angstroms, via plasma enhanced chemical vapor deposition, (PECVD), procedures. Insulator layer 2, will be used as a stop layer, when defining the narrow diameter contact hole in an overlying dielectric layer. An interlevel dielectric layer, (ILD), 3, comprised of silicon oxide, or borophosphosilicate glass, (BPSG), using tetraethylorthosilicate, (TEOS), as a source, is next deposited to a thickness between about 5000 to 10000 Angstroms, via PECVD procedures. Insulator 4a, again comprised of either silicon oxynitride or silicon nitride, is then deposited on ILD layer 3, at a thickness between about 500 to 3000 Angstroms, again via use of PECVD procedures. Insulator layer 4a, will serve as an anti-reflective coating, (ARC), layer, allowing optimum resolution of an overlying photoresist shape to be realized. In addition insulator layer 4a, will serve as a hard mask, to allow the narrow diameter contact hole feature to be transferred to underlying ILD layer 3, without the use of an overlying photoresist shape. Photoresist shape 5, is then formed, to a thickness between about 4000 to 6000 Angstroms, featuring opening 6a, obtained via conventional photolithographic exposure and development procedures, with opening 6a, featuring a diameter between about 0.06 to 0.35 um. The results of these deposition and photolithographic procedures are schematically shown in FIG. 1.

Figure 2:
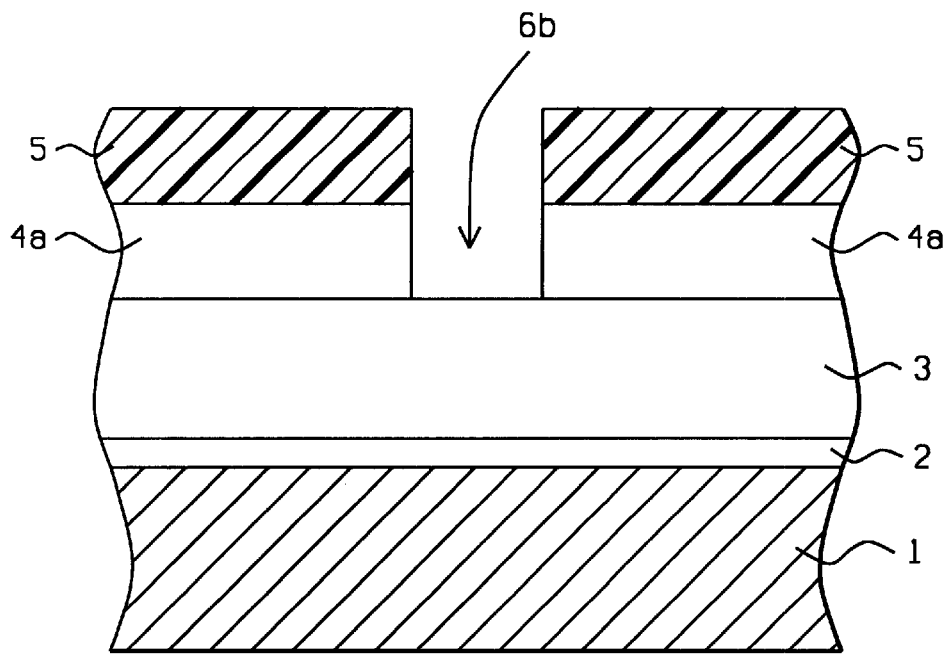

A first step of the in situ dry etching procedure is next addressed, resulting in the definition of opening 6b, formed in insulator layer 4a, using photoresist shape 5, featuring small diameter opening 6a, as an etch mask. This is schematically shown in FIG. 2. Opening 6b, in insulator layer 4a, is formed via a dry etch, or anisotropic, reactive ion etching, (RIE), procedure, performed at a power between about 1000 to 1500 watts, at a pressure between about 50 to 100 mtorr, and using an etch ambient that is comprised with, between about 50 to 100 sccm of $CF_4$, between about 5 to 20 sccm of $O_2$, and between about 80 to 200 sccm of argon. The first step of the dry etch procedure is performed in a chamber in a dry etch tool, such as a reactive ion etching, (RIE), tool.

Figure 3:
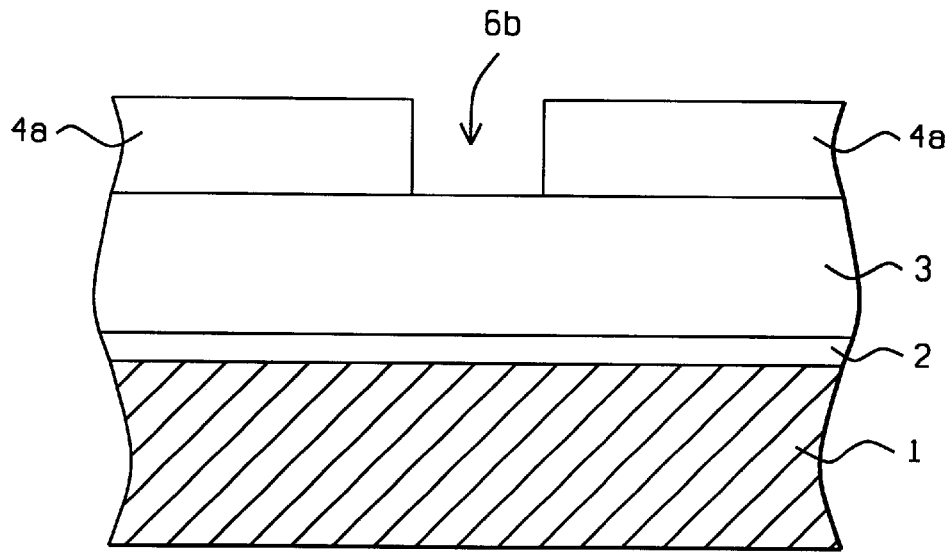

The first step of the in situ dry etching procedure is terminated at the appearance of ILD layer 3, followed by the in situ removal of photoresist shape 5, performed in the same chamber of the dry etch tool previously used for the first step of the in situ dry etching procedure. The in situ removal of photoresist shape 5, is accomplished at a power between about 500 to 1000 watts, at a pressure between about 100 to 300 mtorr, and using an ambient comprised with; between about 50 to 100 sccm of $O_2$, and between about 10 to 20 sccm of $N_2$. The result of the in situ photoresist removal procedure is schematically shown in FIG. 3.

Figure 4:
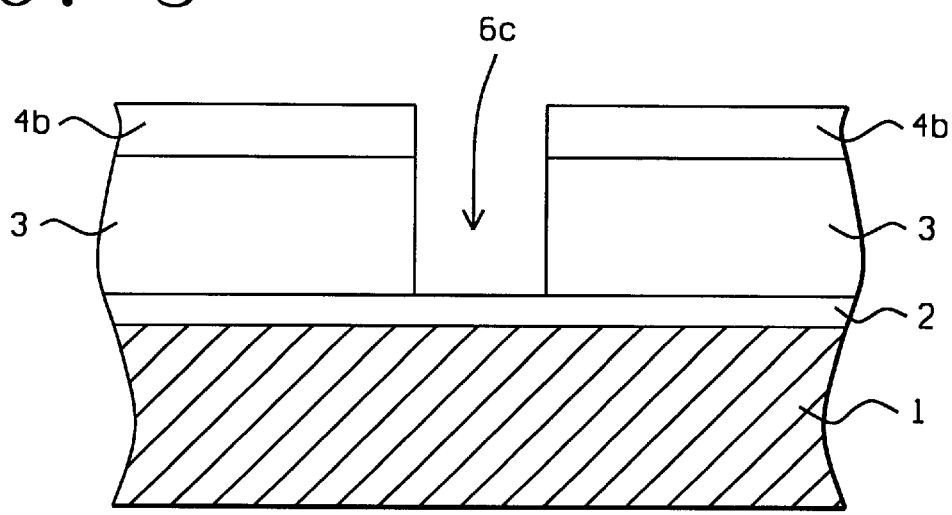

A second step, of the in situ dry etch procedure is next used to selectively form opening 6c, in ILD layer 3. This is schematically shown in FIG. 4. This in situ, selective, anisotropic RIE step, is performed using insulator layer, or hard mask layer 4a, featuring opening 6b, as an etch mask. The second step of the in situ dry etching procedure is performed at a power between about 1000 to 2000 watts, at a pressure between about 40 to 70 mtorr, and using an etch ambient comprised with; between about 5 to 16 sccm of $C_4F_8$, between about 50 to 400 sccm of CO, between about 100 to 500 sccm of argon, and between about 1 to 10 sccm of $O_2$. The selectivity of etch rate ratio of ILD silicon oxide layer 3, to hard mask, SiON layer 4a, and to SiON stop layer 2, is between about 20 to 50, to 1, allowing this second step of the in situ dry etch procedure to slow or terminate at the appearance of insulator stop layer 2. In addition hard mask insulator layer 4a, is only slightly etched, resulting in thinner, insulator layer, or hard mask insulator layer 4b, shown schematically in FIG. 4. The lower selectivity, or etch rate ratio, of ILD layer 3, to photoresist, would have warranted a thicker photoresist shape to be used, if the photoresist shape were used to define opening 6c, in ILD layer 3. The ability to resolve the narrow diameter feature in a thicker photoresist layer, might not be easily attainable and therefore the use of hard mask insulator layer 4a, as a defining mask is critical. The second step of the in situ dry etch procedure again is performed in the same dry etching chamber, and tool used for the previous procedures.

Figure 5:
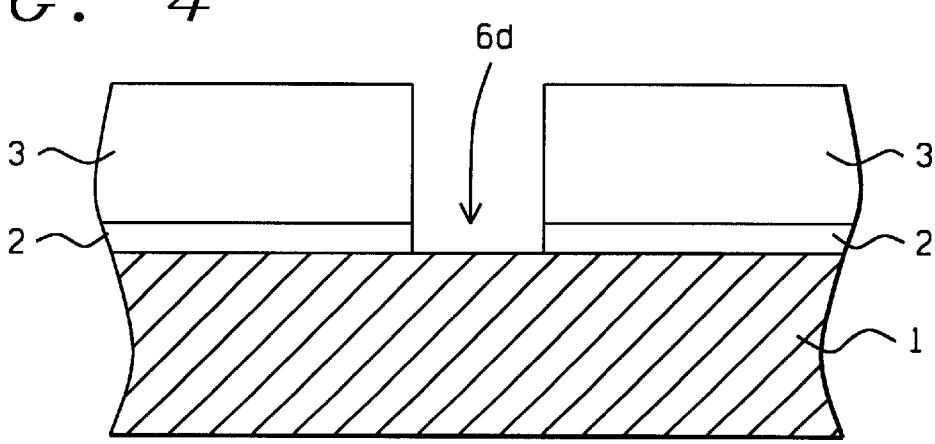

A third, and final step, of the in situ dry etch procedure is next addressed, to create the small diameter opening in insulator stop layer 2. Hard mask insulator layer 4b, is used as an etch mask allowing the third step of the in situ dry etch procedure to define opening 6d, exposing the top surface of conductive region 1. This is schematically shown in FIG. 5. The third step of the dry etch procedure is performed at a power between about 300 to 500 watts, at a pressure between about 50 to 100 mtorr, and using an etch ambient comprised with; between about 20 to 60 sccm of $CH_2F_2$, between about 50 to 100 sccm of argon, and between about 10 to 20 sccm of $O_2$. Since the removal rate of conductive region 1, is small when exposed to this etch ambient, an over etch cycle is used to completely remove hard mask insulator layer 4b. The use of the insulator stop layer for final definition of small diameter contact hole opening 6d, results in a borderless contact hole, since misalignment can now be tolerated. The diameter of the small diameter contact hole opening, is identical to opening 6a, in photoresist shape 5, between about 0.06 to 0.35 um. The third step of this in situ dry etching procedure was again performed in the same RIE chamber and tool used for the previous dry etching steps.

While this invention has been particularly shown and described with reference to, the preferred embodiments thereof, it will be understood by those skilled in the art that various changes in form and details may be made without departing from the spirit and scope of this invention.

What is claimed is:

1. A method of forming a contact hole opening in a composite dielectric layer on a semiconductor substrate, comprising the steps of:

providing a conductive region on said semiconductor substrate;

forming a composite dielectric layer on said conductive region with said composite dielectric layer comprised of an underlying first insulator layer, a dielectric layer located on said underlying first insulator layer, and an overlying hard mask insulator layer located on said dielectric layer;

forming a photoresist shape on said overlying hard mask insulator layer with an opening in said photoresist shape exposing a portion of the top surface of said overlying hard mask insulator layer;

performing a first dry etch procedure in a dry etching chamber using said photoresist shape as an etch mask, forming an opening in said overlying hard mask insulator layer;

removing said photoresist shape in situ in said dry etching chamber;

performing a second dry etch procedure in said dry etching chamber, using said opening in said overlying hard mask insulator layer as an etch mask, forming an opening in said dielectric layer, and resulting in thinning of said hard mask insulator layer; and performing a third dry etch procedure in said dry etching chamber using thinned, overlying hard mask insulator layer as an etch mask, forming an opening in said underlying insulator layer, and completely removing said thinned overlying hard mask insulator layer, resulting in formation of said contact hole opening in said dielectric layer and in said underlying insulator layer, exposing said portion of top surface of said conductive region.

2. The method of claim 1, wherein said underlying insulator layer is comprised of either silicon oxynitride, or silicon nitride, obtained via plasma enhanced chemical vapor deposition (PECVD), procedures at a thickness between about 200 to 600 Angstroms.

3. The method of claim 1, wherein said dielectric layer is comprised of either silicon oxide, or borophosphosilicate glass, obtained via PECVD procedures to a thickness between about 5000 to 10000 Angstroms, using TEOS as a source.

4. The method of claim 1, wherein said overlying hard mask insulator layer is comprised of either silicon oxynitride, or silicon nitride, obtained via PECVD procedures to a thickness between about 500 to 3000 Angstroms.

5. The method of claim 1, wherein said opening in said photoresist shape has a diameter between about 0.06 to 0.35 um.

6. The method of claim 1, wherein said first dry etching procedure used to form said opening in said overlying insulator layer, is performed in said dry etching chamber, at a power between about 1000 to 1500 watts, at a pressure between about 50 to 100 mtorr, using an etch ambient comprised of; between about 50 to 100 sccm of $CF_4$, between about 5 to 20 sccm of $O_2$, and between about 80 to 200 sccm of argon.

7. The method of claim 1, wherein said photoresist shape is removed in situ in said dry etching chamber, at a power between about 500 to 1000 watts, at a pressure between about 100 to 300 mtorr, in an ambient comprised of; between about 50 to 100 sccm of $O_2$, and between about 10 to 20 sccm of $N_2$.

8. The method of claim 1, wherein said second dry etching procedure used to form said opening in said dielectric layer, is performed in said dry etching chamber, at a power between about 1000 to 2000 watts, at a pressure between about 40 to 70 mtorr, using an etch ambient comprised of between about 5 to 16 sccm of $C_4F_8$, between about 50 to 400 sccm of CO, between about 1 to 10 sccm of $O_2$, and between about 100 to 500 sccm of argon.

9. The method of claim 1, wherein the etch rate ratio of said dielectric layer to said overlying hard mask insulator layer, and to said underlying insulator layer, using etch conditions and etch ambient of said second dry etching procedure, is between about 20 to 1, to 50 to 1.

10. The method of claim 1, wherein said third dry etching procedure used to form said opening in said underlying insulator layer and used to remove said overlying hard mask insulator layer, forming said contact hole opening, is performed in said dry etching chamber, at a power between about 300 to 500 watts, at a pressure between about 50 to 100 mtorr, using an etch ambient comprised of; between about 20 to 60 sccm of $CH_2F_2$, between about 10 to 20 sccm of $O_2$, and between about 50 to 100 sccm of argon.

11. The method of claim 1, wherein said contact hole opening in said dielectric layer and in said underlying insulator layer, is between about 0.06 to 0.35 um.

12. A method of forming a contact hole opening in a composite insulator layer on a semiconductor substrate, wherein a photoresist shape is used to define an opening in a hard mask insulator layer, and wherein said opening in said hard mask insulator layer is used to define the bottom portion of the contact hole opening, with the hard mask insulator layer totally removed during definition of the bottom portion of the contact hole opening, comprising the steps of:

providing a conductive region on said semiconductor substrate;

depositing an underlying insulator stop layer on said conductive region, depositing a dielectric layer on said insulator stop layer;

depositing overlying, said hard mask insulator layer on said dielectric layer;

forming said contact hole defining photoresist shape on said hard mask insulator layer, with a small diameter opening in said contact hole defining photoresist shape exposing a portion of a top surface of said hard mask insulator layer;

performing a first dry etch procedure in a chamber of said dry etch tool, forming said opening in said hard mask layer, exposing a portion of a top surface of said dielectric layer;

removing said contact hole defining photoresist shape, in situ in said chamber of said dry etch tool;

performing a second dry etch procedure, in situ in said chamber of said dry etch tool using said opening in said hard mask insulator layer as an etch mask, selectively removing said portion of said dielectric layer exposed in said opening in said hard mask insulator layer, resulting in a hole opening in said dielectric layer exposing a portion of a top surface of said insulator stop layer and resulting in thinning of said hard mask insulator layer; and performing a third dry etch procedure in situ in said chamber of said dry etch tool using said opening in thinned hard mask layer as an etch mask, removing said portion of said insulator stop layer exposed in said hole opening in said dielectric layer, resulting in a hole opening in said insulator stop layer, exposing a portion of a top surface of said conductive region, and with said third dry etch procedure completely removing said thinned hard mask insulator layer, resulting in said bottom portion of said contact hole opening comprised of said opening in said dielectric layer, and said opening in said insulator stop layer.

13. The method of claim 12, wherein said conductive region is a metal silicide layer, selected from the group consisting of cobalt silicide, titanium silicide, and nickel silicide.

14. The method of claim 12, wherein said insulator stop layer is comprised of either silicon oxynitride, or silicon nitride, obtained via plasma enhanced chemical vapor deposition, (PECVD), procedures at a thickness between about 200 to 600 Angstroms.

15. The method of claim 12, wherein said dielectric layer is comprised of either silicon oxide, or borophosphosilicate glass, obtained via PECVD procedures to a thickness between about 5000 to 10000 Angstroms, using TEOS as a source.

16. The method of claim 12, wherein said hard mask insulator layer is comprised of either silicon oxynitride, or silicon nitride, obtained via PECVD procedures to a thickness between about 500 to 3000 Angstroms.

17. The method of claim 12, wherein said small diameter opening in said contact hole defining photoresist shape has a diameter between about 0.06 to 0.35 um.

18. The method of claim 12, wherein said first dry etching procedure used to form said opening in said hard mask insulator layer, is performed in said chamber of said dry etching tool at a power between about 1000 to 1500 watts, at a pressure between about 50 to 100 mtorr, using an etch ambient comprised of between about 50 to 100 sccm of $CF_4$, between about 5 to 20 sccm of $O_2$, and between about 80 to 200 sccm of argon.

19. The method of claim 12, wherein said contact hole defining photoresist shape is removed in situ, in said chamber of said dry etching tool at a power between about 500 to 1000 watts, at a pressure between about 100 to 300 mtorr, in an ambient comprised of; between about 50 to 100 sccm of $O_2$, and between about 10 to 20 sccm of $N_2$.

20. The method of claim 12, wherein said second dry etching procedure used to form said opening in said dielectric layer, is performed in said chamber of said dry etching tool, at a power between about 1000 to 2000 watts, at a pressure between about 40 to 70 mtorr, using an etch ambient comprised of; between about 5 to 16 sccm of $C_4F_8$, between about 50 to 400 sccm of CO, between about 1 to 10 sccm of $O_2$, and between about 100 to 500 sccm of argon.

21. The method of claim 12, wherein the etch rate ratio of said dielectric layer to said hard mask insulator layer and to said insulator stop layer, using etch conditions and etch ambient of said second dry etching procedure, is between about 20 to 1 to 50 to 1.

22. The method of claim 12, wherein said third dry etching procedure used to form said opening in said insulator stop layer, and to remove said hard mask insulator layer forming said contact hole opening, is performed in said chamber of said dry etching tool at a power between about 300 to 500 watts, at a pressure between about 50 to 100 mtorr, using an etch ambient comprised of, between about 20 to 60 sccm of $CH_2F_2$, between about 10 to 20 sccm of $O_2$, and between about 50 to 100 sccm of argon.

23. The method of claim 12, wherein said contact hole opening in said dielectric layer and in said insulator stop layer, is between about 0.06 to 0.35 um.

* * * * *